(12) United States Patent
Gesch et al.

(10) Patent No.: US 6,492,824 B1
(45) Date of Patent: Dec. 10, 2002

(54) ADAPTER BASE FOR RECEIVING ELECTRONIC TEST OBJECTS

(76) Inventors: Helmuth Gesch, In der Point 41, Tiefenbach (DE), 84184; Markus Waidelich, Walhallastr. 20, München (DE), 80639

(*) Notice: Subject to any disclaimer, the term of this patent is extended or adjusted under 35 U.S.C. 154(b) by 0 days.

(21) Appl. No.: 09/719,930
(22) PCT Filed: Apr. 5, 2000
(86) PCT No.: PCT/EP00/02995
  § 371 (c)(1),
  (2), (4) Date: Jan. 24, 2001
(87) PCT Pub. No.: WO00/63706
  PCT Pub. Date: Oct. 26, 2000

(30) Foreign Application Priority Data
Apr. 16, 1999 (DE) .................... 299 06 730 U

(51) Int. Cl.$^7$ .................... G01R 31/02; H01R 13/66
(52) U.S. Cl. .................... 324/755; 439/620
(58) Field of Search .................... 324/754, 755, 324/761, 765, 158.1; 439/69, 620; 257/728, 698; 361/760, 783

(56) References Cited

U.S. PATENT DOCUMENTS

| | | | | |
|---|---|---|---|---|
| 4,519,658 A | * | 5/1985 | Biswas | 439/68 |
| 5,010,445 A | * | 4/1991 | Weinold | 361/392 |
| 6,400,576 B1 | * | 6/2002 | Davidson | 361/763 |

* cited by examiner

Primary Examiner—Michael Sherry
Assistant Examiner—Russell M. Kobert
(74) Attorney, Agent, or Firm—Cohen, Pontani, Lieberman & Pavane

(57) ABSTRACT

The invention relates to an adapter base for receiving electronic test objects (DLTT) comprising an outer group (array) of contact pins (26) that pass through the base from the upper side to the lower side, as well as an inner matrix (38) that consists of contacts (36) that protrude only on the lower side corresponding to an area (28) on the upper side which presents no contacts. Each contact pin (26) is connected to a series connection (30) embodied in the adaptor (24) and constituted by a switching transistor (32), as well as at least one capacitor (34) that via a control signal can be connected and disconnected by means of the gate (G) of the switching transistor (32), the gate being connected to a corresponding contact (36) on the lower side.

4 Claims, 1 Drawing Sheet

ADAPTER BASE FOR RECEIVING ELECTRONIC TEST OBJECTS

PRIORITY CLAIM

This is a U.S. national stage of application No. PCT/EP00/02995, filed on Apr. 5, 2000. Priority is claimed on that application and on the following application: Country: Germany, Application No.: 299 06 730.0, Filed: Apr. 16, 1999.

BACKGROUND OF THE INVENTION

1. Field of the Invention

The invention relates to an adapter base for receiving electronic test objects (DUT=device under test), which has an outer group (array) of contact pins led through from its top side to the underside, and also an inner matrix of contacts which are led out only on the underside and to which a region free of circuitry corresponds on the top side.

2. Discussion of the Prior Art

In order to test objects, in particular compact electronic components having a multiplicity of terminals, it is known to clamp these fixedly on a zero insertion force base (ZIF= Zero Insertion Force) which is fixedly connected to a board by its contacts projecting on the underside. The difficulty is that the configuration of the object to be tested varies within a series or from manufacturer to manufacturer, so that only by expending effort and devoting a great deal of time is it possible for the integrated circuit that is to be tested to be connected up in accordance with the requirements. only with the aid of an individually produced transition circuit is it possible for electrical signals and supply voltages to be allocated correctly to the individual contacts.

SUMMARY OF THE INVENTION

The invention is based on the object of remedying this and providing an adapter base for receiving electronic test objects which, within an extremely short time, for all the contact pins simultaneously ascertains the electrical contact of the integrated circuit to be tested and performs automatic switching at the contact pins in accordance with the object to be tested, to be precise depending on whether the contact pins are intended to transmit electronic signals or serve as supply contacts.

In the case of an adapter base of the design explained in the introduction, this object is achieved according to the invention by virtue of the fact that each contact pin is connected to a series circuit which is formed in the adapter and comprises a switching transistor and at least one capacitor which, by means of a control signal, can be connected in and disconnected by the gate of the switching transistor, said gate being connected to an assigned contact on the underside.

The fact that each contact pin is connected to additional electronic components (switching transistor and capacitor) affords the possibility, depending on the required operating mode of the contact pin, of transmitting signals or connecting the contact pin to operating voltage or ground. By means of a control signal supplied by a control unit, e.g. computer or PC, the gate of the switching transistor is opened or closed, so that the capacitor is connected in as required.

It is advantageous if two capacitors having different capacitances are provided.

In another embodiment of the invention, the contact pins are designed as spring pins, which ensure a reliable connection between the soldering lands of the board accommodating the components to be tested and the contacts of the adapter base.

If the adapter base has a multilayer hybrid structure, a highly compact design is possible which allows a multiplicity of components to be accommodated in the base. Thus, it is possible for instance to accommodate 225 transistors and 500 capacitors, for example, in a plurality of layers.

BRIEF DESCRIPTION OF THE DRAWINGS

The invention is explained below using an exemplary embodiment illustrated in the drawing in which.

DETAILED DESCRIPTION OF THE PREFERRED EMBODIMENTS

Figure 1:
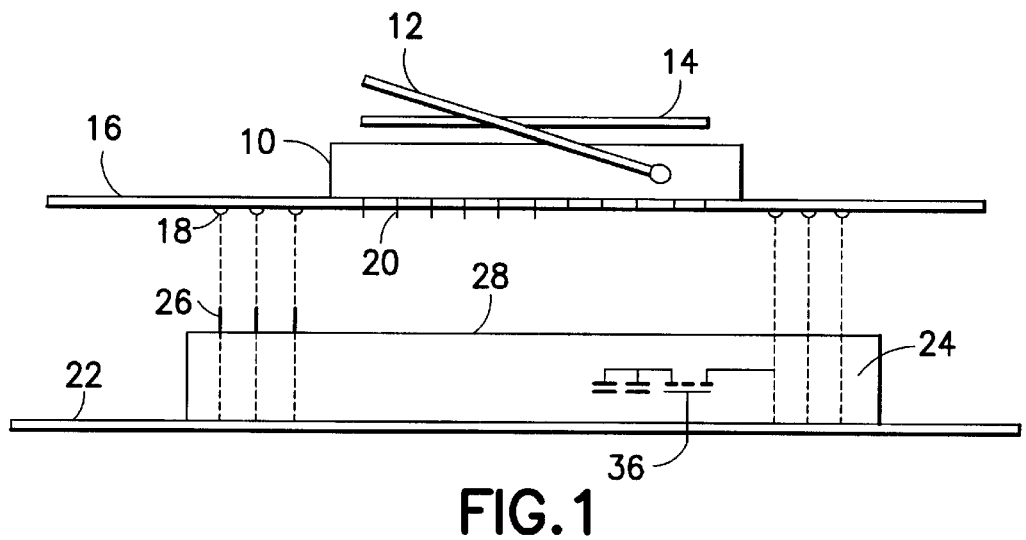
FIG. 1 shows a schematic view of an adapter base according to the invention for testing an object.

FIG. 1 shows the schematic side view of a zero insertion force base 10 (ZIF base), on the top side of which the test object 14 (DUT=device under test) can be fixed by means of a clamping clip 12. The zero insertion force base 10 is fixed on a board 16 having an outer group (array) of soldering lands 18 on its underside, each of which soldering lands is connected, in a manner that is not illustrated, to a terminal 20 on the underside of the zero insertion force base 10.

Figure 2:
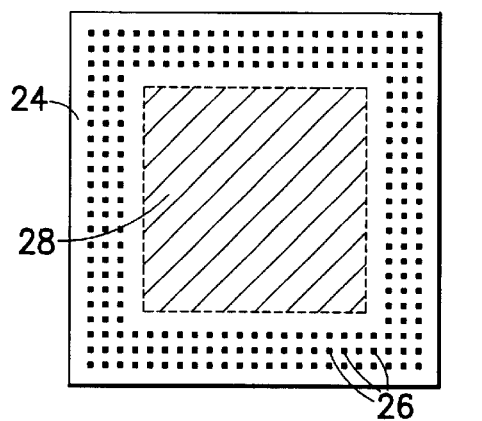
FIG. 2 shows the top side of the adapter base from FIG. 1.

The adapter base 24 according to the invention is fitted on a further board 22. This adapter base has an outer group (array) of contact pins 26—which can be seen in FIG. 2 which are led through as spring pins from the top side to the underside of the adapter base 24. The configuration of this array of contact pins 26 corresponds exactly to the array of soldering lands 18 of the board 16 receiving the test object 14. In the present case, the adapter base 24 is square, the array of contact pins 26 being formed on all four edges, whereas the hatched, square central region 28 is free of circuitry.

Figure 4:
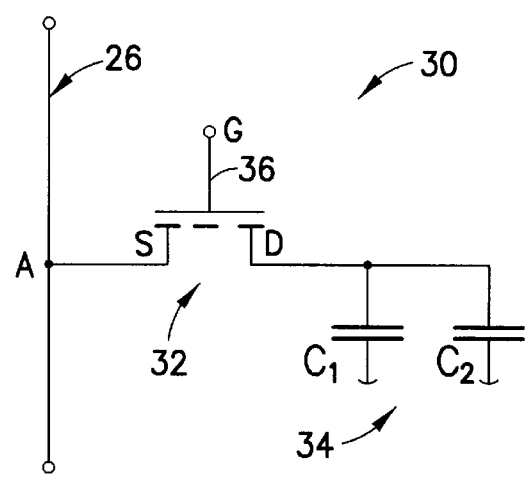
FIG. 4 shows the circuitry of a contact pin (spring pin) according to the invention.

The invention makes provision, in accordance with the schematic illustration in FIGS. 1 and 4, for each contact pin 26 in the adapter base 24 to be connected to a series circuit 30 formed from additional electronic components, comprising a switching transistor 32 and two capacitors $C_1$ and $C_2$.

The terminal contact 36 of the gate G of the switching transistor 32 is led out from the underside of the adapter base 24 and forms, with the other gate terminals 36, an inner matrix 38 of contacts which corresponds to the region 28 which is free of circuitry and is provided on the top side of the adapter base 24.

Depending on the electrical driving of the contact pins 26, the latter can transmit digital or analog signals or be connected as supply terminal for operating voltage. Specifically, if a contact pin 26 carries supply voltage, the corresponding gate G of the assigned switching transistor 32 receives control voltage, so that said transistor is closed and the two capacitors 34 are linked to the contact pin 26 in a low-resistance manner. Conversely, if a signal is transmitted via the contact pin 26, for example with frequencies of up to 100 MHz, the gate G of the switching transistor 32 remains open, so that the capacitors 34 are not connected in.

The switching transistors 32 are driven by means of control signals supplied by a control unit, for example a computer or a PC.

Figure 3:
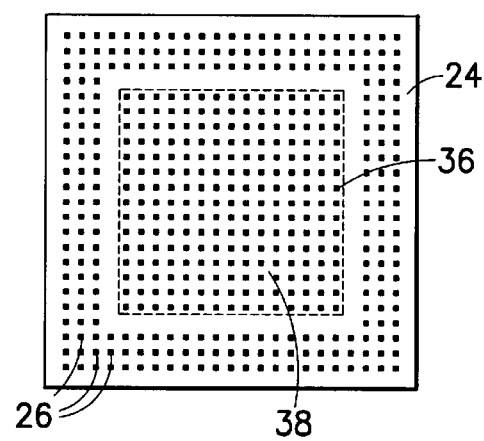
FIG. 3 shows the underside of the adapter base.

As already mentioned, the adapter base 24 according to the invention may have a multilayer hybrid structure in a ceramic design, so that a multiplicity of components can be accommodated. In the exemplary embodiment illustrated in FIGS. 2 and 3, three layers are provided, one of which receives 225 transistors 32, while in each case 550 capacitors 34 are accommodated in two further layers.

Thus, while there have been shown and described and pointed out fundamental novel features of the present invention as applied to a preferred embodiment thereof, it will be understood that various omissions and substitutions and changes in the form and details of the devices illustrated, and in their operation, may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

What is claimed is:

1. An adapter base for receiving electronic test objects, comprising: a base member; an outer group (array) of contact pins led through from a top side of the base member to a underside of the base member; an inner matrix of contacts which are led out only on the underside of the matrix and to which a region free of circuitry corresponds on the top side; and a series circuit connected to each contact pin formed in the adapter base member and comprising a switching transistor and at least one capacitor which, by means of a control signal, can be connected in and disconnected by a gate of the switching transistor, the gate being connected to an assigned contact on the underside.

2. An adapter base as defined in claim 1, wherein two capacitors having different capacitances are provided in the series circuit.

3. An adapter base as defined in claim 1, wherein the contact pins are spring pins.

4. An adapter base as defined in claim 1, which has a multilayer, compact hybrid construction.

* * * * *